United States Patent
Vogel et al.

(10) Patent No.: US 8,085,540 B2
(45) Date of Patent: Dec. 27, 2011

(54) TANDEM FAN ASSEMBLY WITH AIRFLOW-STRAIGHTENING HEAT EXCHANGER

(75) Inventors: Marlin R. Vogel, Milpitas, CA (US); David W. Copeland, Mountain View, CA (US); Andrew R. Masto, San Jose, CA (US)

(73) Assignee: Oracle America, Inc., Redwood Shores, CA (US)

( * ) Notice: Subject to any disclaimer, the term of this patent is extended or adjusted under 35 U.S.C. 154(b) by 171 days.

(21) Appl. No.: 12/683,006

(22) Filed: Jan. 6, 2010

(65) Prior Publication Data

US 2011/0164384 A1 Jul. 7, 2011

(51) Int. Cl.
*H05K 7/20* (2006.01)
*F28F 13/12* (2006.01)

(52) U.S. Cl. .................. 361/701; 165/104.33; 165/122; 361/696; 361/699; 361/700

(58) Field of Classification Search .................. 361/696, 361/700, 701
See application file for complete search history.

(56) References Cited

U.S. PATENT DOCUMENTS

| | | | | |
|---|---|---|---|---|
| 3,317,798 A * | 5/1967 | Chu et al. | | 361/696 |
| 5,054,545 A * | 10/1991 | Ghaemian | | 165/104.33 |
| 6,754,076 B2 * | 6/2004 | Cox et al. | | 361/699 |
| 6,819,563 B1 * | 11/2004 | Chu et al. | | 361/696 |
| 7,023,696 B2 * | 4/2006 | Ko | | 361/695 |
| 7,142,424 B2 * | 11/2006 | Malone et al. | | 361/697 |
| 7,626,815 B2 * | 12/2009 | Stefanoski | | 361/679.47 |
| 2004/0246677 A1 * | 12/2004 | Chen | | 361/697 |
| 2005/0061485 A1 * | 3/2005 | Hirafuji et al. | | 165/104.21 |
| 2007/0070604 A1 * | 3/2007 | Tomioka et al. | | 361/696 |

* cited by examiner

*Primary Examiner* — Gregory Thompson
(74) *Attorney, Agent, or Firm* — Park, Vaughan, Fleming & Dowler LLP

(57) ABSTRACT

A tandem fan system with an airflow-straightening heat exchanger removes heat from an airflow while providing optimal airflow pressure. The tandem fan system includes a first fan assembly and a second fan assembly, wherein each fan assembly has an inlet face and an outlet face, and includes at least one fan configured to propel a flow of air from the inlet face to the outlet face. The tandem fan system also includes a heat exchanger coupled between the first and second fan assemblies, wherein the heat exchanger includes at least one fin array and one or more heat pipes. The fin array and heat pipe combination is configured to draw heat from a flow of air that flows through the heat exchanger, and to straighten the flow of air so that the flow is perpendicular to the inlet face of the second fan assembly.

20 Claims, 6 Drawing Sheets

TANDEM FAN ASSEMBLY WITH AIRFLOW-STRAIGHTENING HEAT EXCHANGER

BACKGROUND

1. Field

The disclosed embodiments are related to cooling mechanisms. More specifically, the disclosed embodiments are related to a fan assemblies.

2. Related Art

Many large corporations are increasing their use of data centers as they develop new ways of using information systems to optimize their business operations. Furthermore, the increasing popularity of the Internet and cloud-based computing is fueling demand for ever-larger data centers that can store and process enormous volumes of information. Consequently, in an effort to increase the performance of servers in data centers, system designers are equipping servers with more devices (i.e., processors, networking devices, peripheral devices, power converters, and other devices). As the number of devices increases, the heat produced by the devices can cause the internal temperature of a server to rise to a point where the devices can be damaged or can experience significantly shortened lifespans. To mitigate these problems, servers are typically equipped with one or more fans to force a flow of air through the server to remove internal heat from the server.

Some servers produce so much heat that the flow of air produced by fans in traditional arrangements is insufficient to control the internal temperature of the server, some servers include multi-fan assemblies that are configured to generate a high-volume airflow using two fan trays in tandem. For example, FIG. 1A illustrates a typical tandem fan assembly 100, which includes fan trays 102-104 oriented in series and separated by a distance 106. The fans in fan trays 102 and 104 drive a flow of air in direction 108, so that air that exits an outlet face of fan tray 102 enters an inlet face of fan tray 104.

Although they increase overall airflow, fan assemblies (such as tandem fan assembly 100) may not produce an optimal airflow pattern because the airflow that exits the outlet face of fan tray 102 is not perpendicular to the inlet face of fan tray 104. More specifically, the airflow exits the outlet face of fan tray 102 in a turbulent twisting motion (i.e., with an approximately helical velocity vector). Thus, instead of hitting the fan blades of fan tray 104 in the orientation for which the fans in fan tray were optimized (i.e., perpendicular to the face of fan tray 104), the airflow hits the fan blades at suboptimal angles. Consequently, the combination of fan tray 102 and fan tray 104 may produce slightly more airflow pressure than a single fan tray, but does not produce twice the airflow pressure of a single fan tray.

In an effort to increase the efficiency of fan assemblies such as the illustrated fan assembly, designers have included airflow-straightening elements between the fan trays. Airflow-straightening elements can straighten and re-orient the turbulent flow of air as it passes between the fan trays to ensure that the air hits the blades of fan tray 104 at an angle closer to the optimal angle. For example, FIG. 1B illustrates an exemplary tandem fan assembly 110 with an airflow-straightener 116. Tandem fan assembly 110 includes fan trays 112 and 114 oriented in series, and includes an airflow-straightener 116 between fan trays 112-114. The fans in fan trays 112 and 114 drive a flow of air in direction 118, such that air that exits an outlet face of fan tray 112 flows through airflow-straightener 116 before entering an inlet face of fan tray 114. Airflow-straightener 116 can include a set of fins for straightening the flow of air. For example, FIG. 1C presents a honeycomb-shaped fin 122 in an airflow straightener 120.

Unfortunately, because the fans can consume a significant portion of a server's overall power, and because a limited number of fan assemblies can be mounted on a given server, many servers cannot be kept sufficiently cool even using these existing multi-fan assemblies.

SUMMARY

The described embodiments provide a tandem fan system that removes heat from an airflow while also providing improved airflow pressure. The tandem fan system includes a first fan assembly and a second fan assembly. Each of these fan assemblies has an inlet face and an outlet face, and at least one fan coupled between the inlet face and the outlet face. In the described embodiments, the fans are configured to draw a flow of air into the inlet face and propel the flow of air out of the outlet face. The tandem fan system also includes a heat exchanger coupled between the first fan assembly and the second fan assembly.

In the described embodiments, the heat exchanger includes a first face coupled to the outlet face of the first fan assembly, and a second face coupled to the inlet face of the second fan assembly. The heat exchanger further includes at least one fin array coupled between the first face and the second face that is configured to straighten a flow of air that flows through the heat exchanger from the outlet face of the first fan assembly to the inlet face of the second fan assembly. The heat exchanger also includes one or more heat pipes coupled between the first face and the second face configured to draw heat from the flow of air that flows through the heat exchanger.

In some embodiments, the at least one fin array includes a corrugated fin.

In some embodiments, the one or more heat pipes are interdigitated with the at least one fin array.

In some embodiments, a heat pipe is mechanically coupled to fins of at least one neighboring fin array.

In some embodiments, the heat exchanger also includes an inlet header coupled to one end of the one or more heat pipes, and an outlet header coupled to an opposing end of the one or more heat pipes.

In some embodiments, the heat exchanger also includes a mechanical pump configured to propel a flow of a liquid or a gas in the heat pipe from the inlet header to the outlet header.

In some embodiments, the liquid or gas is selected from the group consisting of: air; water; a liquid coolant in an R133 group of coolants; and a liquid coolant in an R134 group of coolants.

In some embodiments, a heat pipe includes a set of internal fins.

In some embodiments, the set of internal fins includes at least one corrugated fin.

In some embodiments, a heat pipe has a depth of between 20 mm and 40 mm, which spans the first face and the second face of the heat exchanger.

In some embodiments, two neighboring fins in the at least one fin array have a separation distance of between 0.5 mm and 2 mm.

In some embodiments, a fin in the at least one fin array has a length of between 10 mm and 20 mm.

In some embodiments, a fin in the at least one fin array has a depth between 20 mm and 40 mm, which spans the first face and the second face of the heat exchanger.

In some embodiments, a fan assembly has a depth equal to 50 mm.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Air-Cooling Tandem Fan System

The described embodiments provide a fan assembly that uses two or more fan trays to generate an airflow that can be used to cool devices in a server, a computer system, or in another device. In the described embodiments, the tandem fan assembly includes at least one heat exchanger mounted between the fan trays. In these embodiments, the heat exchanger includes one or more mechanisms for straightening and cooling an airflow that is driven through the fan assembly.

Figure 1A:
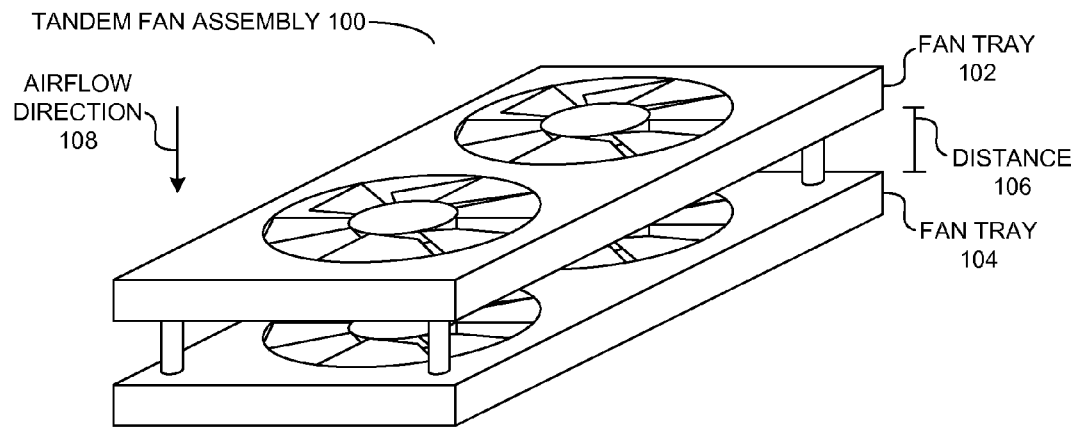
FIG. 1A illustrates a typical tandem fan assembly.
Figure 1B:
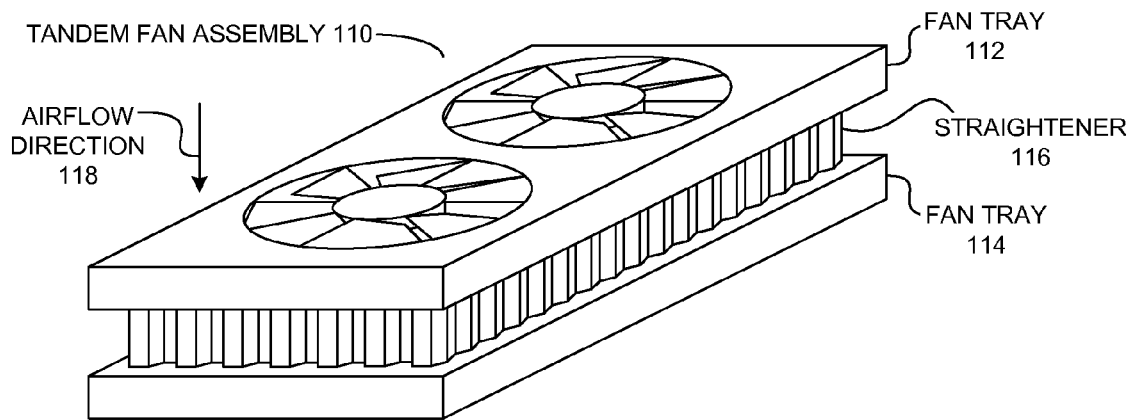
FIG. 1B illustrates a typical tandem fan assembly with an airflow-straightener.
Figure 1C:
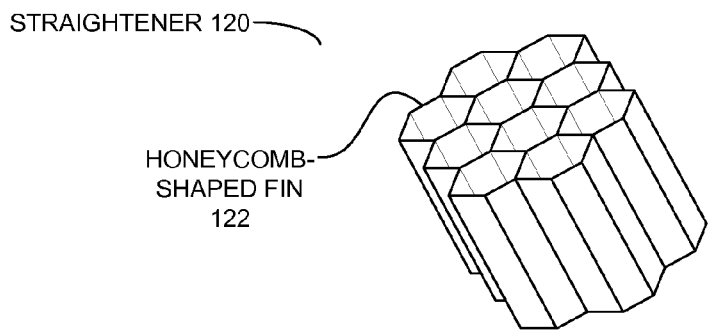
FIG. 1C illustrates a honeycomb-shaped fin in an airflow-straightener.
Figure 2A:
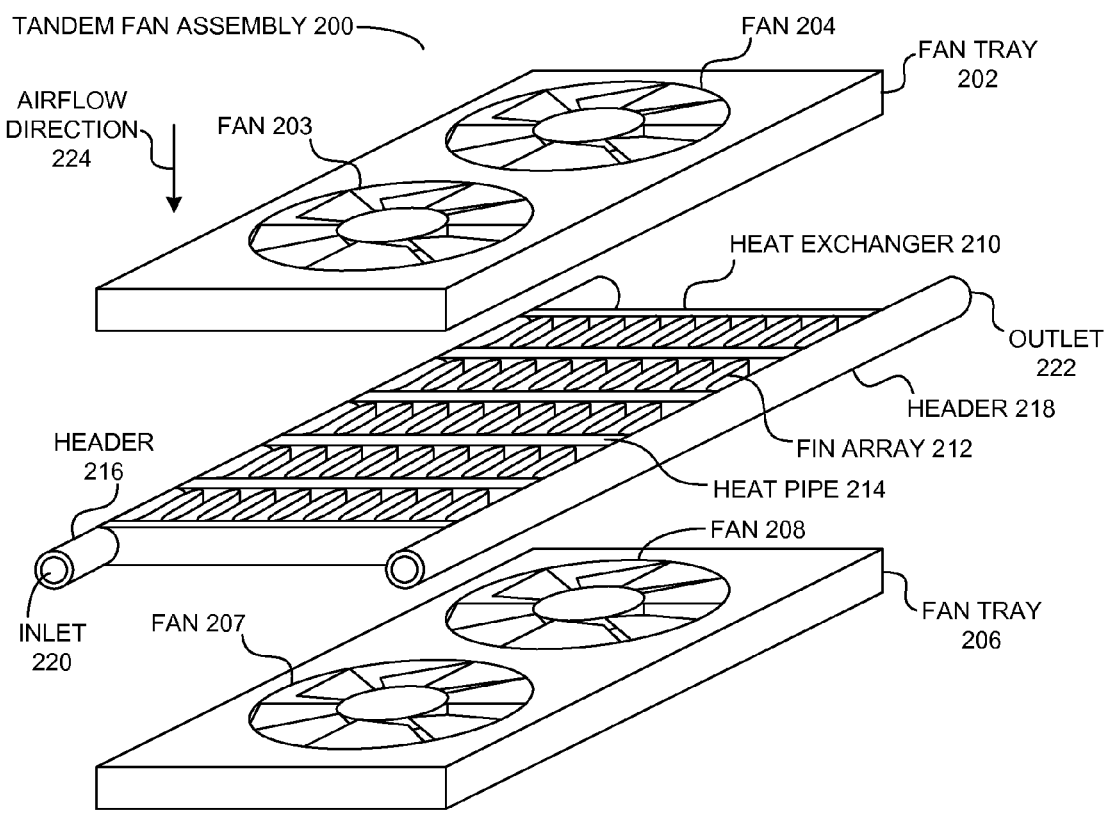
FIG. 2A illustrates elements of a tandem fan assembly in accordance with the described embodiments.

FIG. 2A illustrates elements of a tandem fan assembly 200 in accordance with the described embodiments. Tandem fan assembly 200 includes two fan trays (i.e., fan trays 202 and 206) coupled in series, and a heat exchanger 210 coupled between fan trays 202 and 206. Each fan tray has an inlet face and an outlet face. The fans of a given fan tray (e.g., fans 203-204 of fan tray 202) draw an airflow into the inlet face and propel an airflow out of the outlet face.

In the described embodiments, one face of heat exchanger 210 is coupled to the outlet face of fan tray 202, and an opposing face of heat exchanger 210 is coupled to the inlet face of fan tray 206. During operation, fans 203-204 are configured to propel an airflow in a direction 224 so that the airflow passes through heat exchanger 210. In addition, fans 207-208 of fan tray 206 are configured to draw an airflow from heat exchanger 210 in direction 224.

In some embodiments, heat exchanger 210 includes a set of fin arrays that includes at least one fin array (e.g., fin array 212), a set of heat pipes that includes at least one heat pipe (e.g., heat pipe 214), and headers 216-218. The set of fin arrays can be mechanically coupled to the set of heat pipes to form a fin assembly, in which the set of fin arrays is interdigitated with the set of heat pipes in an alternating sequence of fin arrays and heat pipes along an axis of heat exchanger 210.

Moreover, the fin arrays and the heat pipes of heat exchanger 210 are located in a common space (i.e., within a common layer). This configuration enables heat exchanger 210 to reduce the heat in the airflow and to provide an airflow oriented in a predetermined direction with a lower drop in airflow pressure than is possible by a system that is implemented using a separate heat exchanger and airflow-straightener (i.e., a physically separate heat exchanger and airflow-straightener).

Fin array 212 is configured to straighten the direction of airflow that flows from fan tray 202 to fan tray 206 so that the airflow arrives at fan tray 206 in a predetermined orientation with respect to the inlet face of fan tray 206. For example, in some embodiments, fin array 212 is configured to straighten the direction of airflow and orient the airflow so that the airflow arrives at the inlet face of fan tray 206 oriented perpendicularly to the inlet face of fan tray 206. Furthermore, the fins of a fin array are thermally coupled (i.e., mechanically coupled using one or more heat-transferring coupling mechanisms) to neighboring heat pipes, to increase the surface area of the heat exchanger that captures heat from the airflow. More specifically, as the fans of tandem fan assembly 200 propel the airflow through heat exchanger 210, the fins of heat exchanger 210 capture heat from the airflow while straightening the airflow, and transfer the captured heat to the neighboring heat pipes.

Heat pipe 214 is configured to capture heat from the airflow that travels from fan tray 202 to fan tray 206, and to transfer the heat through a header (e.g., header 218) on heat exchanger 210 to an environment outside tandem fan assembly 200. Each heat pipe 214 is an oval-shaped tube with a cavity filled with a heat-transferring gas or liquid. As shown in FIG. 2A, headers 216 and 218 can be coupled to opposing ends of each heat pipe, and configured so that the heat-transferring fluid flows from header 216, through the heat pipe, and to header 218. In the described embodiments, one or more elements of heat exchanger 210 (e.g., the fins of a fin array, a heat tube, and/or a header) are formed using a heat-conducting material such as copper, aluminum, a ceramic material, or another material.

In some embodiments, a mechanical pump (e.g., pump 406 in FIG. 4) can drive a heat-transferring fluid into header 216 and draw the heat-transferring fluid from header 218. More specifically, the mechanical pump can drive a heat-transferring fluid into at least one of the two ends of header 216 (e.g., via inlet 220). Then, the heat-transferring fluid is driven through the one or more heat pipes, absorbing heat that is captured from the airflow by the fin assemblies of heat exchanger 210. The heat-transferring fluid is then driven out of heat exchanger 210 via at least one of the two ends of header 218 (e.g., via outlet 222).

Figure 2B:
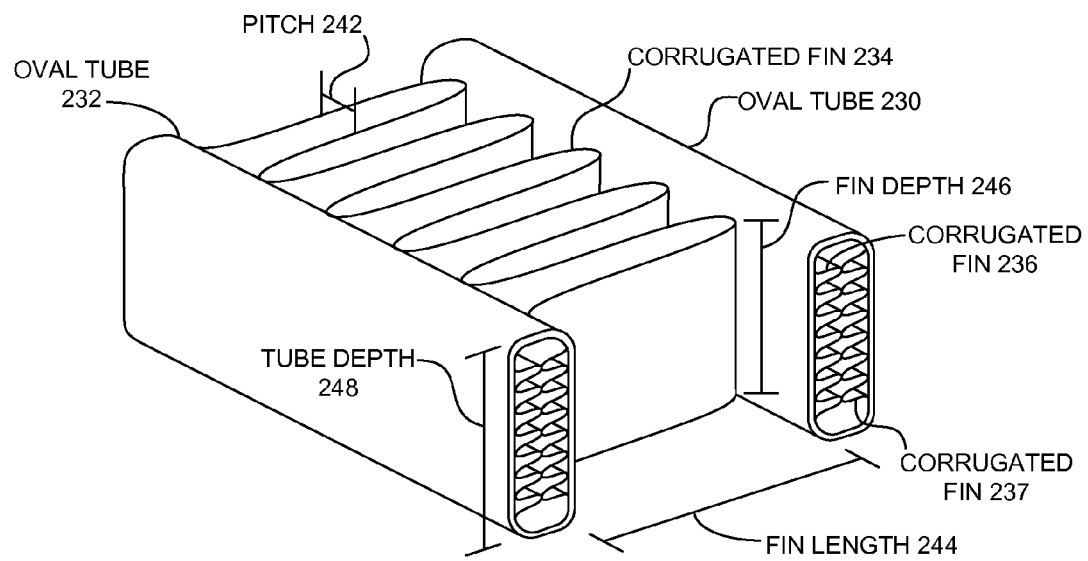
FIG. 2B illustrates a cross-section of a portion of a heat exchanger in accordance with the described embodiments.

FIG. 2B illustrates a cross-section of a portion of heat exchanger 210 in accordance with the described embodiments. The heat exchanger cross-section includes two tubes with oval cross-sections (i.e., oval tubes 230-232), and a corrugated fin 234 coupled between oval tube 230 and oval tube 232. Corrugated fin 234 corresponds to fin array 212 of FIG. 2A, such that corrugated fin 234 includes a series of folds that form alternating parallel ridges and furrows. Also, oval tubes 230-232 correspond to a heat pipe of FIG. 2A (e.g., heat pipe 214).

The configurations and dimensions of a heat exchanger can vary for different tandem fan assemblies. For example, corrugated fin 234 can have a pitch 242 (i.e., a separation distance between consecutive folds of the corrugated fin) that can vary from 0.5 mm to 2 mm. Furthermore, the depth of a corrugated fin and/or the depth of an oval tube (i.e., fin depth 246 and tube depth 248) can each vary from 20 mm to 40 mm. The fin length 244 (i.e., the separation distance between two neighboring oval tubes) can vary from 10 mm to 20 mm. Although we describe particular ranges of sizes and dimensions for the elements shown in FIG. 2B, in alternative embodiments other sizes and dimensions can be used.

Oval tubes 230-232 can be assembled using a configuration that increases their efficiency for capturing heat from the airflow through heat exchanger 210. For example, oval tubes 230-232 include a set of internal fins (e.g., fins 236-237) that guide the direction of heat-transferring fluid that flows within oval tubes 230-232. These internal fins can cause the heat-transferring fluid to flow more efficiently through oval tube 230 (e.g., by minimizing turbulence in the flow), thereby allowing heat-transferring fluid that has a lower temperature to enter oval tube 230 at a higher rate. The more efficient flow can lower the operating temperature of oval tube 230, which in turn increases the ability for oval tube 230 to capture heat from the airflow through heat exchanger 210.

In some embodiments, the internal fins can include one or more corrugated fins (i.e., corrugated fins 236-237) that have an orientation that is parallel to the side walls of the enclosing oval tube (i.e., perpendicular to a face of the heat exchanger). In alternative embodiments, the internal fins can include an array of individual fins (not shown) that have an orientation that is perpendicular to the side walls of the enclosing oval tube (i.e., parallel to a face of the heat exchanger).

In some embodiments, the internal fins of oval tube 230 can be configured to mix the heat-transferring fluid as it flows through oval tube 230, thereby enabling the heat-transferring fluid to remove heat from an ambient airflow more efficiently. For example, the pattern of a corrugated fin can vary at different portions of oval tube 230 so that heat-transferring fluid which is in thermal contact with oval tube 230 at one portion of oval tube 230 is forced toward the center of oval tube 230 at a different portion of oval tube 230. Similarly, heat-transferring fluid which is at the center of oval tube 230 at one portion of oval tube 230 is forced toward the wall of oval tube 230 at a different portion of oval tube 230.

Figure 3:
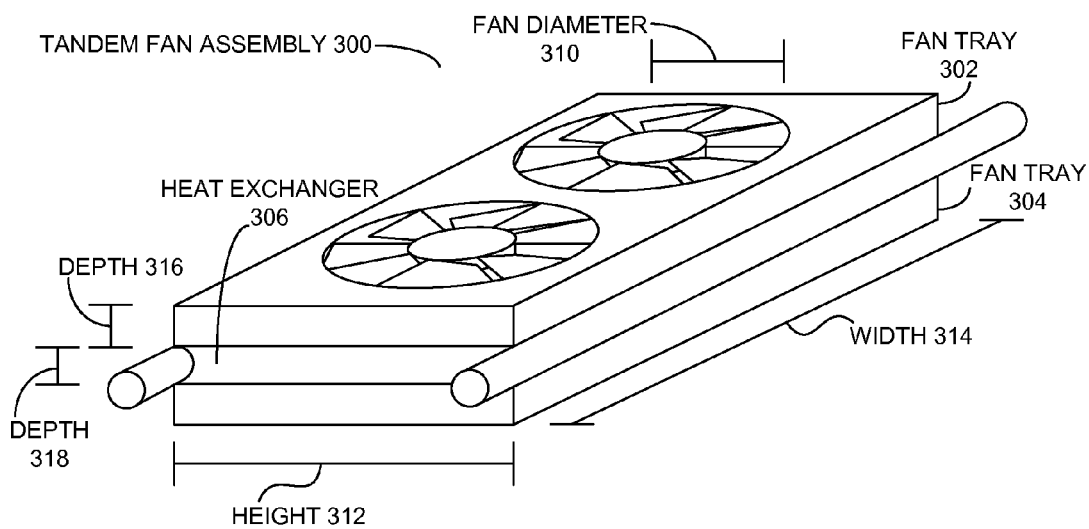
FIG. 3 illustrates an assembled tandem fan assembly in accordance with the described embodiments.

FIG. 3 illustrates an assembled tandem fan assembly 300 in accordance with the described embodiments. Tandem fan assembly 300 includes fan trays 302-304, and a heat exchanger 306. A typical fan tray can include two fans with a fan diameter 310 that is equal to 150 mm. Correspondingly, typical dimensions of fan trays 302-304 and heat exchanger 306 can include a height 312 equal to 200 mm, a width 314 equal to 400 mm, and a depth 316 equal to 50 mm.

Moreover, fan trays 302 and 304 can be mechanically coupled to opposing sides of heat exchanger 306. For example, the outflow face of fan tray 302 can be coupled to a face of heat exchanger 306 by using one or more binding techniques known in the art, such as brazing, gluing, binding with epoxy, welding, or mechanically attaching (e.g., bolting, screwing, etc.). This configuration ensures that a gap does not separate a fan tray from heat exchanger 306, so that the airflow that exits the outflow face of fan tray 302 flows directly to the inflow face of fan tray 304.

Although we describe particular dimensions and configurations for the illustrated embodiments, alternative embodiments are of different sizes and arrangements. For example, the dimensions of fan trays 302-304 and heat exchanger 306 can vary depending on fan diameter 310, the number of fans per fan tray, and a minimum spacing required between two fans on a fan tray or between an edge of a fan and the perimeter of the fan tray. In some embodiments, fan diameter 310 can vary from 100 mm to 200 mm. Further, a fan tray with two fans and a minimum spacing of 25 mm can have a minimum height 312 that varies from 150 mm to 250 mm, and can have a minimum width 314 that varies from 275 mm to 475 mm.

Although we show fan trays 302 and 304 directly coupled to heat exchanger 306, in alternative embodiments, a standoff (not shown) can be used to attach a fan tray to heat exchanger 306, thereby separating fan trays 302-304 from heat exchanger 306 by a predetermined distance. More specifically, the outflow face of fan tray 302 can be oriented a predetermined distance from a first side of heat exchanger 306, and the inflow face of fan tray 304 can be oriented a predetermined distance from an opposing side of heat exchanger 306. In this configuration, the separation distance between the outflow face of fan tray 302 and the inflow face of fan tray 304 can vary from 25 mm to 50 mm. Further, depth 318 for heat exchanger 306 can vary from 20 to 40 mm, such that depth 318 is not greater than the separation distance between fan trays 302 and 304. In these embodiments, the standoff can be configured so that a gap does not separate one of the fan trays from a standoff or a standoff from heat exchanger 306 in order to guarantee that the airflow that exits the outflow face of fan tray 302 flows directly to the inflow face of fan tray 304.

Figure 4:
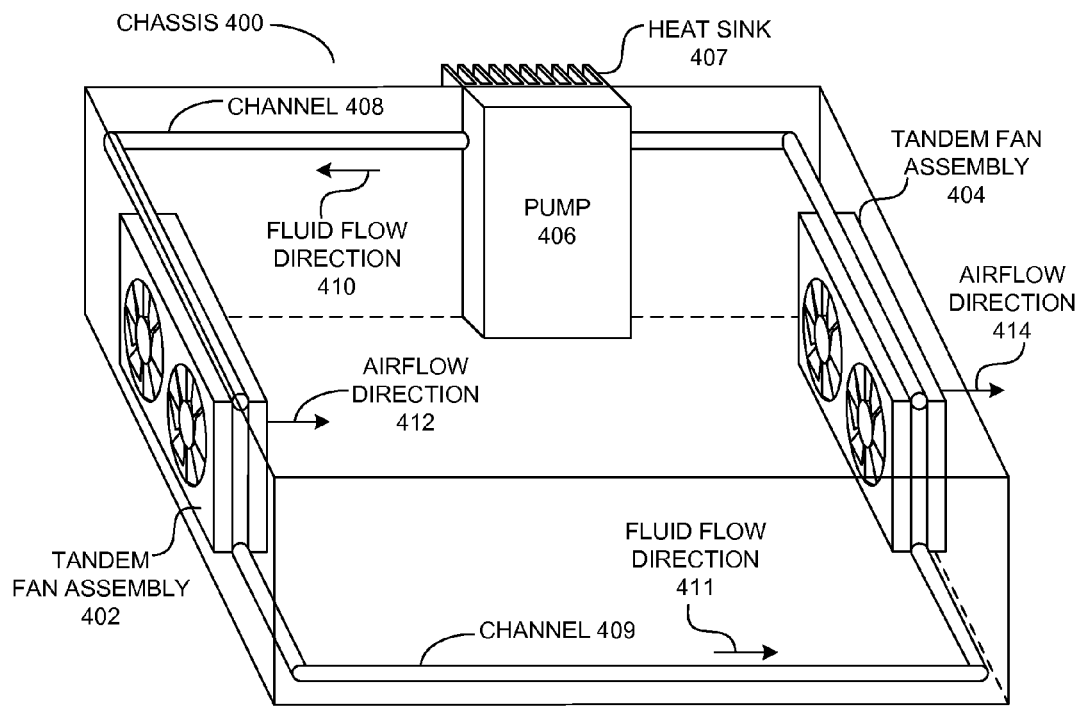
FIG. 4 illustrates a chassis that includes a tandem fan assembly in accordance with the described embodiments.

FIG. 4 illustrates a chassis that includes a tandem fan assembly in accordance with the described embodiments. In some embodiments, chassis 400 can be a chassis for a computer system, which provides a housing for a variety of heat-producing computer components such as one or more power supplies, processing elements (e.g., a microprocessor, an expansion card, etc.), cards (e.g., network cards), and/or memory storage devices. In other embodiments, chassis 400 can be mounted in a cabinet that houses a number of similar chassis and/or other computing devices, such as rack-mount servers.

Chassis 400 includes tandem fan assemblies 402-404, a pump 406, a heat sink 407, and channels 408-409. During operation, pump 406 drives a liquid or a gas through channels 408-409 in fluid-flow directions 410-411, respectively. Pump 406 can be thermally coupled to heat sink 407 to transfer heat from the liquid or gas to an environment that is external to chassis 400. In some embodiments, pump 406 can drive a cooled liquid that is obtained from a source external to chassis 400 to increase the temperature gradient between the liquid in the heat exchanger and the airflow that is being cooled by the heat exchanger.

In some embodiments, pump 406 drives the fluid through tandem fan assembly 402 and tandem fan assembly 404 in series. Specifically, channel 409 is coupled to an outlet port for a header on tandem fan assembly 402, and is coupled to an inlet port for a header on tandem fan assembly 404, thereby circulating a fluid flow in direction 411. In other embodiments, pump 406 drives the fluid through tandem fan assembly 402 and tandem fan assembly 404 in parallel (not shown).

Tandem fan assembly 402 can be configured to propel airflow in airflow direction 412 into chassis 400. Unlike a typical fan assembly, the heat exchanger of tandem fan assembly 402 decreases the heat load that is transferred from the external environment and from the motors of tandem fan assembly 402 into chassis 400. Furthermore, tandem fan assembly 404 can be configured to propel airflow from chassis 400 in airflow direction 414 into an external environment (e.g., a server room). Unlike a typical fan assembly, the heat exchanger of tandem fan assembly 404 decreases the heat load that is transferred from the interior of chassis 400 into the external environment.

Note that chassis 400 can include more or fewer tandem fan assemblies and channels oriented in a variety of configurations to achieve a desired airflow pressure and/or volume of cooled airflow that traverses heat-producing components (not shown, but including processors, peripheral devices, cards, interface devices, networking devices, etc.) in chassis 400. For example, additional tandem fan assemblies can be configured to propel cooled airflow into chassis 400, and/or additional fan assemblies can be configured to propel cooled airflow from the interior of chassis 400 to the external environment. Furthermore, a set of channels can be configured to drive a fluid flow through one group of tandem fan assemblies in series while driving other fluid flows through other tandem fan assemblies in parallel.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A tandem fan system, comprising:
    a first fan assembly and a second fan assembly, wherein each fan assembly has an inlet face and an outlet face and at least one fan coupled between the inlet face and the outlet face, wherein the at least one fan is configured to propel a flow of air from the inlet face to the outlet face; and
    a heat exchanger coupled between the first fan assembly and the second fan assembly, comprising:
        a first face coupled to the outlet face of the first fan assembly and a second face coupled to the inlet face of the second fan assembly;
        at least one fin array coupled between the first face and the second face, wherein the fin array is configured to straighten a flow of air that flows through the heat exchanger from the outlet face of the first fan assembly to the inlet face of the second fan assembly so that the flow is oriented in a predetermined direction with respect to the inlet face of the second fan assembly; and
        one or more heat pipes coupled to the at least one fin array between the first face and the second face, wherein the one or more heat pipes are configured to draw heat from the flow of air that flows through the heat exchanger.

2. The tandem fan system of claim 1, wherein the at least one fin array includes a corrugated fin.

3. The tandem fan system of claim 1, wherein the one or more heat pipes are interdigitated with the at least one fin array.

4. The tandem fan system of claim 3, wherein the heat exchanger is configured to straighten the flow of air so that it is oriented in a perpendicular direction with respect to the inlet face of the second fan assembly.

5. The tandem fan system of claim 1, wherein the heat exchanger further comprises:
    an inlet header coupled to one end of the one or more heat pipes; and
    an outlet header coupled to an opposing end of the one or more heat pipes.

6. The tandem fan system of claim 5, further comprising a mechanical pump configured to propel a flow of a liquid or a gas in the one or more heat pipes from the inlet header to the outlet header.

7. The tandem fan system of claim 6, wherein the liquid or gas is selected from the group consisting of:
    air; water; a liquid coolant in an R133 group of coolants; and a liquid coolant in an R134 group of coolants.

8. The tandem fan system of claim 1, wherein the one or more heat pips comprise a set of internal fins.

9. The tandem fan system of claim 8, wherein the set of internal fins includes a corrugated fin.

10. The tandem fan system of claim 1, wherein one or more heat pipes have a depth between 20 mm and 40 mm, which spans the first face and the second face of the heat exchanger.

11. The tandem fan system of claim 1, wherein two neighboring fins in the at least one fin array have a separation distance between 0.5 mm and 2 mm.

12. The tandem fan system of claim 1, wherein a fin in the at least one fin array has a length between 10 mm and 20 mm.

13. The tandem fan system of claim 1, wherein a fin in the at least one fin array has a depth between 20 mm and 40 mm, which spans the first face and the second face of the heat exchanger.

14. The tandem fan system of claim 1, wherein a fan assembly has a depth equal to 50 mm.

15. A method for cooling air using fan assemblies, wherein each fan assembly has an inlet face and an outlet face and at least one fan coupled between the inlet face and the outlet face, wherein the at least one fan is configured to propel a flow of air from the inlet face to the outlet face, the method comprising:
    using a first fan assembly and a second fan assembly to propel air from the outlet face of the first fan assembly to the inlet face of the second fan assembly; and
    using a heat exchanger coupled between the first fan assembly and the second fan assembly to straighten the flow of air so that it is oriented in a perpendicular direction with respect to the inlet face of the second fan assembly by:
        coupling a first face of the heat exchanger to the outlet face of the first fan assembly;
        coupling a second face of the heat exchanger to the inlet face of the second fan assembly;
        coupling at least one fin array between the first face and the second face, wherein the fin array is configured to straighten a flow of air that flows through the heat exchanger from the outlet face of the first fan assembly to the inlet face of the second fan assembly so that the flow is oriented in a predetermined direction with respect to the inlet face of the second fan assembly; and
        coupling one or more heat pipes to the at least one fin array between the first face and the second face, wherein the one or more heat pipes are configured to draw heat from the flow of air that flows through the heat exchanger.

16. The method of claim 15, wherein the at least one fin array includes a corrugated fin.

17. The method of claim 15, wherein the method further comprises configuring the one or more heat pipes to be interdigitated with the at least one fin array.

18. The method of claim 15, wherein the method further comprises:
    coupling an inlet header to one end of the one or more heat pipes; and
    coupling an outlet header to an opposing end of the one or more heat pipes.

19. The method of claim 18, wherein the method further comprises configuring a mechanical pump to propel a flow of a liquid or a gas in the one or more heat pipes from the inlet header to the outlet header.

20. An electronic device, comprising:
   a chassis;
   a first fan assembly and a second fan assembly coupled to the chassis, wherein each fan assembly has an inlet face and an outlet face and at least one fan coupled between the inlet face and the outlet face, wherein the at least one fan is configured to propel a flow of air from the inlet face to the outlet face; and
   a heat exchanger coupled between the first fan assembly and the second fan assembly, comprising:
      a first face coupled to the outlet face of the first fan assembly and a second face coupled to the inlet face of the second fan assembly;
      at least one fin array coupled between the first face and the second face, wherein the fin array is configured to straighten a flow of air that flows through the heat exchanger from the outlet face of the first fan assembly to the inlet face of the second fan assembly so that the flow is oriented in a predetermined direction with respect to the inlet face of the second fan assembly; and
   one or more heat pipes coupled to the at least one fin array between the first face and the second face, wherein the one or more heat pipes are configured to draw heat from the flow of air that flows through the heat exchanger.

* * * * *